United States Patent

Ohkubo et al.

[11] Patent Number: 5,949,096
[45] Date of Patent: Sep. 7, 1999

[54] FIELD EFFECT TRANSISTOR WITH STABILIZED THRESHOLD VOLTAGE

[75] Inventors: Satoru Ohkubo; Yasuo Ohno; Kazuaki Kunihiro, all of Tokyo, Japan

[73] Assignee: NEC Corporation, Tokyo, Japan

[21] Appl. No.: 09/150,775

[22] Filed: Sep. 10, 1998

[30] Foreign Application Priority Data

Sep. 29, 1997 [JP] Japan .................................. 9-264300

[51] Int. Cl.[6] ...................... H01L 31/0328; H01L 29/80
[52] U.S. Cl. .......................... 257/192; 257/194; 257/279; 257/280
[58] Field of Search .................... 257/192, 194, 257/195, 269, 279, 280

[56] References Cited

U.S. PATENT DOCUMENTS

| | | | |
|---|---|---|---|
| 5,250,826 | 10/1993 | Chang et al. | 257/279 |
| 5,436,468 | 7/1995 | Nakata et al. | 257/15 |
| 5,633,516 | 5/1997 | Mishima et al. | 257/190 |
| 5,670,804 | 9/1997 | Usagawa et al. | 257/279 |
| 5,679,963 | 10/1997 | Klem et al. | 257/46 |
| 5,789,771 | 8/1998 | Liu et al. | 257/279 |

FOREIGN PATENT DOCUMENTS 362144367  6/1987  Japan ..................... 257/279

OTHER PUBLICATIONS

Blum et al., AlxGa1–xAs device arrays, IBM technical disclosure bulletin, vol. 15, No. 2, pp. 443–444, Jul. 1972.

*Primary Examiner*—Tom Thomas
*Assistant Examiner*—Ori Nadav
*Attorney, Agent, or Firm*—Young & Thompson

[57] ABSTRACT

In a field effect transistor, a semiconductor channel layer is formed for carriers to run therein, and a first conductive semiconductor carrier supply layer is formed on the channel layer. Also, a second conductive semiconductor layer has a conductive type opposite to the carrier supply layer or contacts the gate electrode and is formed of same materials as the carrier supply layer. A third conductive semiconductor layer is formed on the layer having a conductive type opposite to the carrier supply layer or contacting the gate electrode and has the same conductive type of the carrier supply layer. A schottky gate electrode is formed in contact with the second conductive semiconductor layer.

16 Claims, 10 Drawing Sheets

$\phi_B$ : BARRIER HEIGHT
$\Delta d$ : VARIANCE OF FILM THICKNESS
$\Delta Vt$ : VARIANCE OF THRESHOLD VOLTAGE
$E_{FB}$ : FERMI LEVEL BEFORE CHANGE
$E_{FA}$ : FERMI LEVEL AFTER CHANGE $\phi_B$ : BARRIER HEIGHT
$\Delta d$ : VARIANCE OF FILM THICKNESS
$\Delta Vt$ : VARIANCE OF THRESHOLD VOLTAGE
$E_{FB}$ : FERMI LEVEL BEFORE CHANGE
$E_{FA}$ : FERMI LEVEL AFTER CHANGE

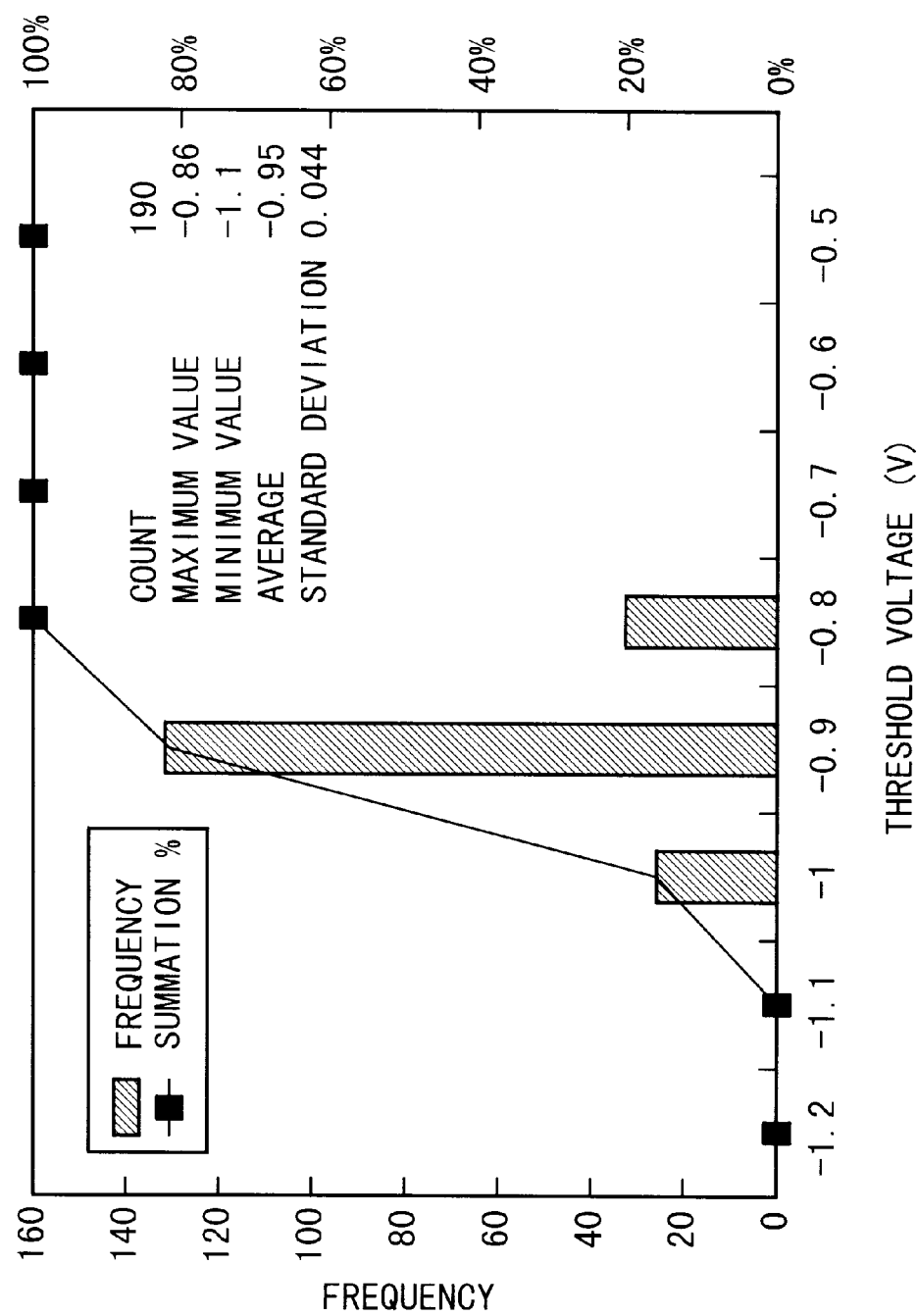

FIELD EFFECT TRANSISTOR WITH STABILIZED THRESHOLD VOLTAGE

BACKGROUND OF THE INVENTION

1. Field of the Invention

The present invention relates to a field effect transistor.

2. Description of the Related Art

FIGS. 1A to 1D are cross sectional views of a field effect transistor in a conventional method of manufacturing the field effect transistor.

Referring to FIG. 1A, an intrinsic type GaAs buffer layer 2 with high purity is formed on a GaAs semi-insulating substrate 1. Subsequently, an intrinsic type $In_{0.15}Ga_{0.85}As$ channel layer 3 with high purity, a Si-doped n-type $Al_{0.2}Ga_{0.8}As$ electron supply layer 4, and a Si-doped n-type GaAs cap layer 5 are laminated on the GaAs buffer layer 2 in this order.

Subsequently, as shown in FIG. 1B, the Si-doped n-type GaAs cap layer 5 is etched using a photoresist layer 6 so as to expose a part of the Si-doped n-type $Al_{0.2}Ga_{0.8}As$ electron supply layer 4.

Subsequently, as shown in FIG. 1C, a Ti layer, a Pt layer and an Au layer (Ti/Pt/Au) are laminated on the exposed part of the Si-doped n-type $Al_{0.2}Ga._{0.8}As$ electron supply layer 4 in this order to form Schottky gate electrode 7.

Next, as shown in FIG. 1D, an AuGe layer, a Ni layer and an Au layer (AuGe/Ni/Au) are laminated in this order on the Si-doped n-type GaAs cap layer 5 on both sides of the Schottky gate electrode 7 to form ohmic source and drain electrodes 8. Subsequently, heat treatment (alloy) is performed to form ohmic alloy layers 9.

This type of field effect transistor formed on the GaAs substrate is called a HJFET (Hetero Junction Field Effect Transistor). In this transistor, electrons generated from the Si-doped n-type $Al_{,0.2}Ga_{0.8}As$ electron supply layer 4 are accumulated as a two-dimensional electron gas in the high purity $In_{0.15}Ga_{0.85}As$ channel layer 3 which is spatially separated from donor atoms. Therefore, the electrons has very high mobility.

FIG. 2 shows a graph showing an electrostatic potential under the Schottky gate electrode of the field effect transistor. In the conventional GaAs HJFET described above, the gate electrode is formed directly on the Si-doped n-type $Al_{0.2}Ga_{0.8}As$ layer 4 which is the electron supply layer. For this reason, the inclination of the electrostatic potential under the gate becomes steeper. In the field effect transistor having such a structure, when the film thickness of the Si-doped n-type $Al_{,0.2}Ga_{0.8}As$ electron supply layer 4 changes in the wafer surface due to epitaxial growth and crystal etching, the threshold voltage of the field effect transistor changes largely even if the change quantity of the film thickness is small, because the inclination of the electrostatic potential near the surface is steep. As a result, in the conventional field effect transistor, there is a problem in that the uniformity and reproducibility are low.

SUMMARY OF THE INVENTION

The present invention is accomplished in view of the above problems. An object of the present invention is to provide a field effect transistor in which the change of a threshold voltage can be restrained.

Another object of the present invention is to provide a field effect transistor in which the reproducibility and uniformity are excellent.

In order to achieve an aspect of the present invention, a field effect transistor includes a semiconductor layer formed for carriers to run therein, a first conductive semiconductor layer formed on the semiconductor layer, having an electron affinity smaller than that of the semiconductor layer and a summation of the electron affinity and a forbidden band width larger than a summation of the electron affinity and a forbidden band width of the semiconductor layer, a second conductive semiconductor layer having a conductive type opposite to the first conductive semiconductor layer and formed of same materials as the first conductive semiconductor layer on the first conductive semiconductor layer, a third conductive semiconductor layer formed on the second conductive semiconductor layer and having the same conductive type of the first conductive semiconductor layer, and a schottky gate electrode formed in contact with the second conductive semiconductor layer.

The field effect transistor may further include drain and source electrodes formed in contact with the third conductive semiconductor layer. Instead, the field effect transistor may further include drain and source electrodes formed in contact with the second conductive semiconductor layer.

In the above field effect transistor, the semiconductor layer may be one of an intrinsic type GaAs layer and an intrinsic type InGaAs layer, the first conductive semiconductor layer may be an N-type AlGaAs layer, the second conductive semiconductor layer may be a P-type AlGaAs layer, and the third conductive semiconductor layer may be an N-type GaAs layer.

Instead, the semiconductor layer may be one of an intrinsic type GaAs layer and an intrinsic type InGaAs layer, the first conductive semiconductor layer may be a P-type AlGaAs layer, the second conductive semiconductor layer may be an N-type AlGaAs layer, and the third conductive semiconductor layer may be a P-type GaAs layer.

In addition, the semiconductor layer may be an intrinsic type InGaAs layer, the first conductive semiconductor layer may be an N-type InAlAs layer, the second conductive semiconductor layer may be a P-type InAlAs layer, and the third conductive semiconductor layer may be an N-type InGaAs layer.

In order to achieve another aspect of the present invention, a field effect transistor includes a channel layer, a carrier supply layer formed on the channel layer, a layer having a conductive type opposite to the carrier supply layer or contacting the gate electrode, and formed on the carrier supply layer, a cap layer formed on the layer having a conductive type opposite to the carrier supply layer or contacting the gate electrode, and a schottky gate electrode formed in contact with the layer having a conductive type opposite to the carrier supply layer or contacting the gate electrode. Here, the layer having a conductive type opposite to the carrier supply layer or contacting the gate electrode is formed to reduce change of a threshold voltage due to a film thickness of the second conductive semiconductor layer.

The carrier supply layer is formed on the channel layer to have an electron affinity smaller than that of the channel layer and a summation of the electron affinity and a forbidden band width larger than a summation of the electron affinity and a forbidden band width of the channel layer. Further, the layer having a conductive type opposite to the carrier supply layer or contacting the gate electrode is formed of same materials as the carrier supply layer. In addition, the cap layer has the same conductive type of the carrier supply layer. Source and drain electrodes are formed in contact with the cap layer. Alternatively, the source and drain electrodes formed in contact with the layer having a conductive type opposite to the carrier supply layer or contacting the gate electrode.

In order to achieve still another aspect of the present invention, a field effect transistor includes a first semiconductor layer for formed for carriers to run therein, a second conductive semiconductor layer formed on the first semiconductor layer and having a conductive type opposite to the first semiconductor layer, a third semiconductor layer formed on the second semiconductor layer and having a same conductive type as the first semiconductor layer, and a schottky gate electrode formed in contact with the second semiconductor layer.

In this case, the first semiconductor layer may be an N-type GaAs layer, the second semiconductor layer may be a P-type GaAs layer, and the third semiconductor layer may be an N-type GaAs layer.

BRIEF DESCRIPTION OF THE DRAWINGS

FIG. 8 is a graph illustrating a relation of threshold voltage and frequency in the field effect transistor manufactured by the method according to the first embodiment of the present invention;

DESCRIPTION OF THE PREFERRED EMBODIMENTS

Next, a field effect transistor of the present invention will be described below in detail with reference to the attached drawings.

The inventors of the present invention found that when a p-type AlGaAs layer is grown on an n-type AlGaAs layer as an electron supply layer, and a gate electrode is formed on the p-type AlGaAs layer, the above-mentioned problems could be solved.

In the present invention, a buffer layer is formed above a semiconductor substrate. The semiconductor layer in which the carriers travel is formed on the buffer layer. A first conductive type semiconductor layer is formed on the semiconductor layer to have an electron affinity smaller than the semiconductor layer and a summation of the electron affinity and a forbidden band width is larger than the semiconductor layer. A second conductive semiconductor layer is formed of the same materials as the first conductive semiconductor layer on the first conductive type semiconductor layer to have the conductive type opposite to that of the first conductive type semiconductor layer. A cap semiconductor layer is formed on the second conductive type semiconductor layer to have the same conductive type as that of the first conductive type semiconductor layer. Also, source and drain ohmic electrodes are formed in contact with the second conductive type semiconductor layer or cap semiconductor layer and a Schottky gate electrode is formed in contact with the second conductive type semiconductor layer.

Figure 5A:
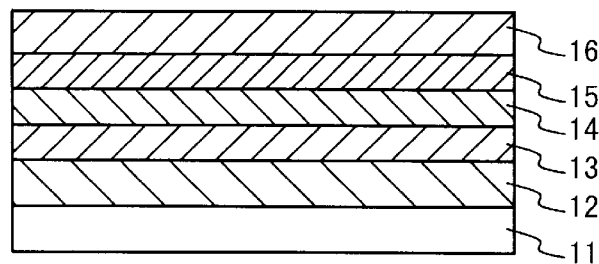
FIGS. 5A to 5D are cross sectional views of a field effect transistor manufactured by a method according to a first embodiment of the present invention.
Figure 5B:
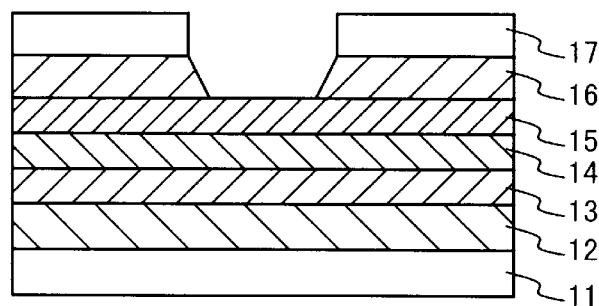

FIGS. 5A to 5B are cross sectional views of the field effect transistor according to the first embodiment of the present invention.

Referring to FIG. 5A, a high purity intrinsic-type GaAs buffer layer 12 with the film thickness of 500 nm, a high purity $In_{0.15}Ga_{0.85}As$ channel layer 13 with the film thickness of 15 nm, a Si-doped ($2\times10^{18}cm^{-3}$) n-type $Al_{0.2}Ga_{0.8}As$ electron supply layer 14 with the film thickness of 27 nm, a C-doped ($2\times10^{18}cm^{-3}$) p-type $Al_{0.2}Ga_{0.8}As$ contact layer 15 with the film thickness of 22 nm, and a Si-doped ($1\times10^{18}cm^{-3}$) n-type GaAs cap layer 16 with the film thickness of 300 nm are grown on a semi-insulating GaAs substrate 11 in this order by a MOCVD method.

Next, as shown in FIG. 5B, after a photoresist layer 17 is patterned, the Si-doped n-type GaAs cap layer 16 is crystal-etched so as to expose a portion of the C-doped p-type $Al_{0.2}Ga_{0.8}As$ layer 15.

Figure 5C:
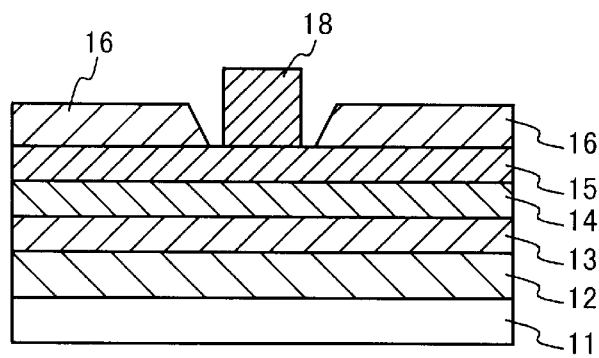

Next, as shown in FIG. 5C, a Schottky gate electrode 18 of a Ti/Pt/Au structure is formed on the exposed portion of the C-doped p-type $Al_{0.2}Ga_{0.8}As$ layer 15 in a vacuum vapor deposition apparatus.

Figure 5D:
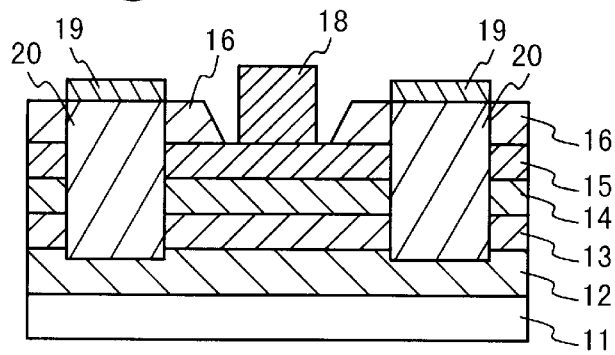

Next, as shown in FIG. 5D, ohmic electrodes 19 composed of AuGe/Ni/Au are formed as a source and a drain on the Si-doped n-type GaAs cap layer 16 on both sides of Schottky gate electrode 18 in the vacuum vapor deposition apparatus. Then, heat treatment is performed at the temperature of 450° C. for alloying such that ohmic alloy layers 20 are formed. Thus, the field effect transistor is completed.

Figure 1A:
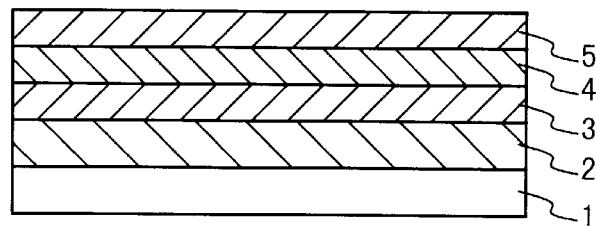
FIGS. 1A to 1D are cross sectional view of a field effect transistor manufactured by a conventional method.
Figure 1B:
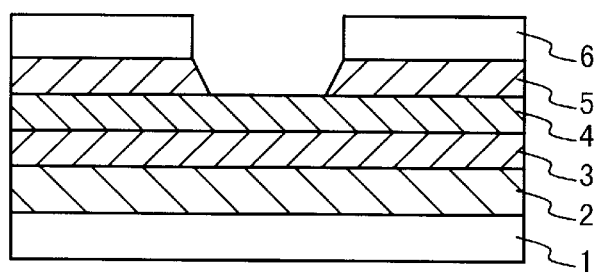
Figure 1C:
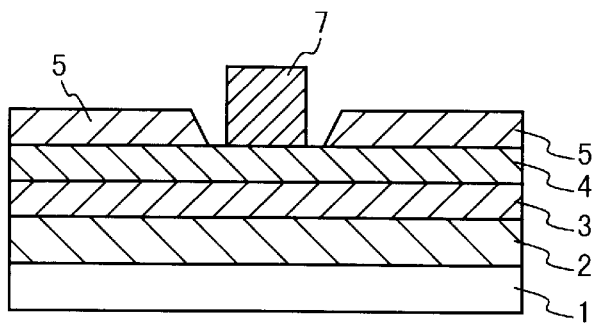
Figure 1D:
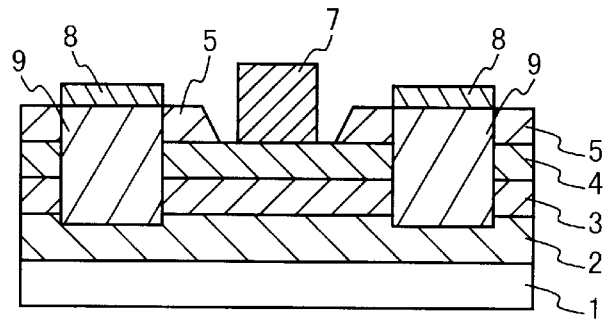
Figure 2:
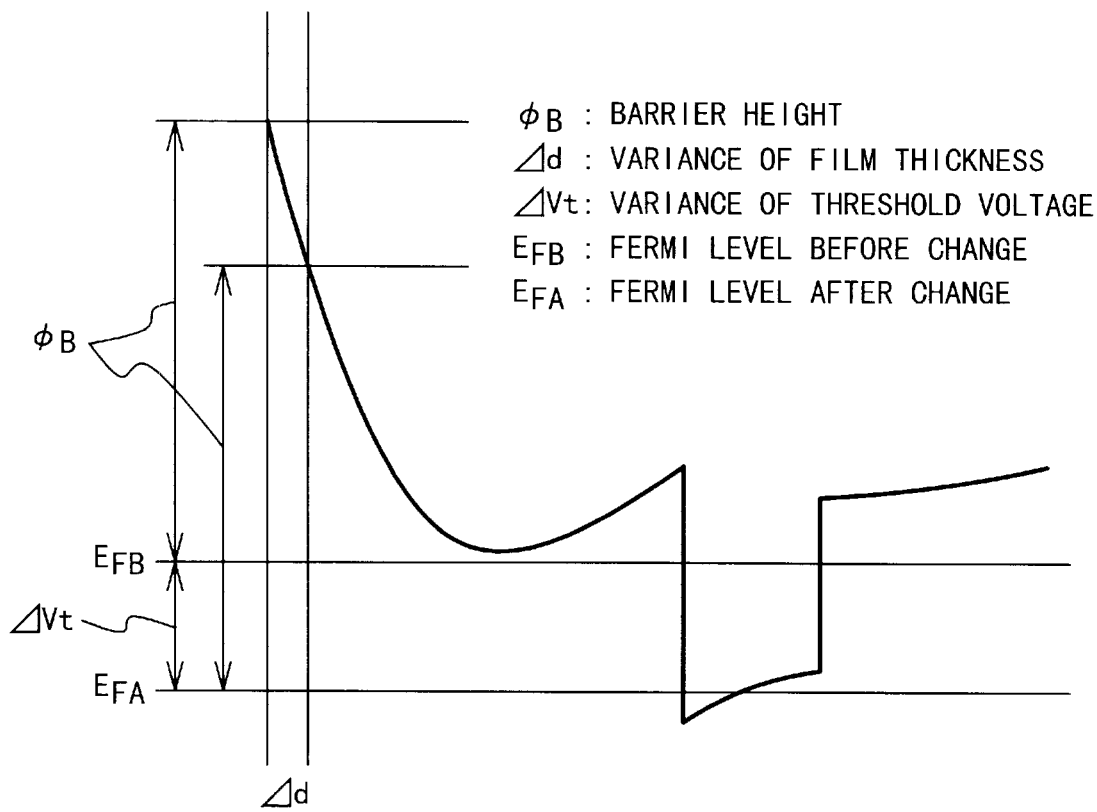
FIG. 2 is an electrostatic potential distribution under a gate electrode in the conventional field effect transistor.
Figure 6:
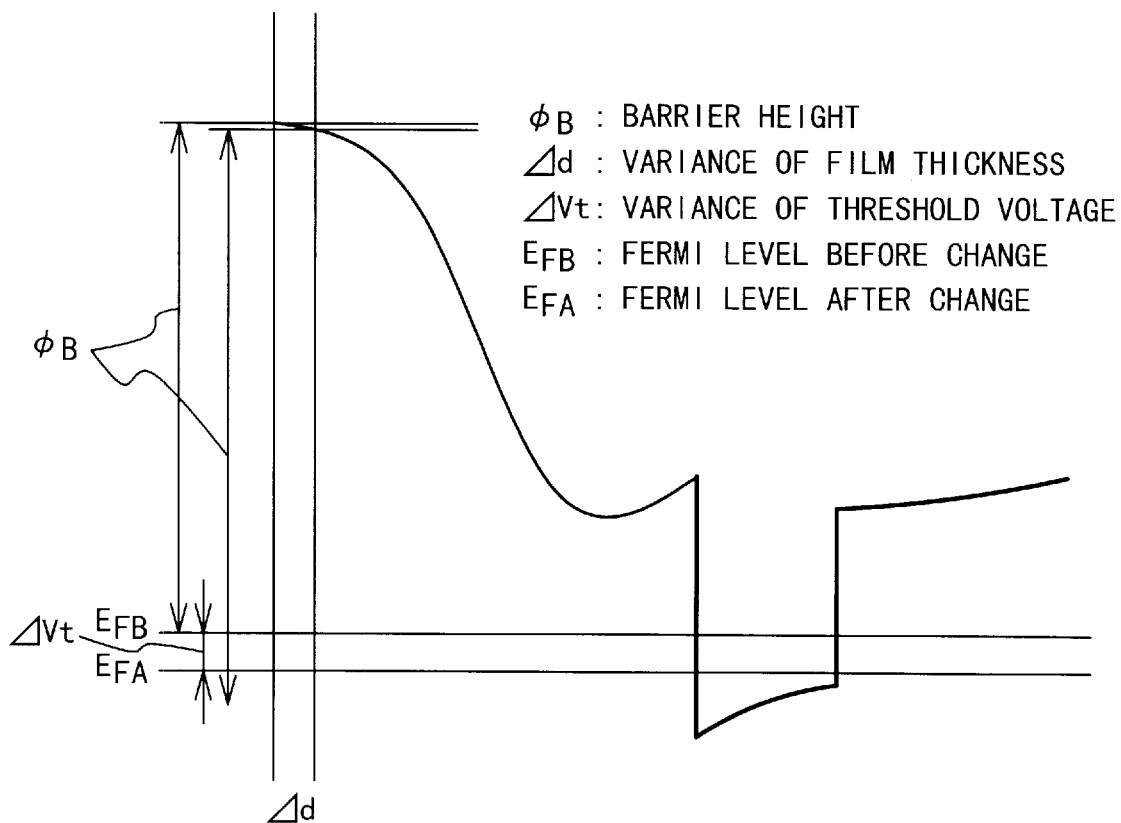
FIG. 6 is an electrostatic potential distribution under a gate electrode in the field effect transistor manufactured by the method according to the first embodiment of the present invention.

This field effect transistor will be described. FIG. 6 shows an electrostatic potential distribution under Schottky gate electrode 18 of Ti/Pt/Au. In this embodiment, the P-type $Al_{0.2}Ga_{0.8}As$ layer 15 is formed on the n-type $Al_{0.2}Ga_{0.8}As$ electron supply layer 14 to form a PN junction. Therefore, the inclination of the electrostatic potential distribution near the surface becomes gentle due to the PN junction, compared with that of the conventional electrostatic potential distribution shown in FIG. 2.

When the film thickness change Δd of the $Al_{0.2}Ga_{0.8}As$ layers 15 occurs because of epitaxial growth and crystal etching, the Fermi level changes from $E_{FB}$ into $E_{FA}$ since the height $\phi_B$ of the barrier is constant. However, since the inclination of the electrostatic potential distribution is gentle, the change quantity of the Fermi level is restrained. This is because the change quantity of the Fermi level is equivalent to the change quantity ΔVt of the threshold voltage of the field effect transistor. In this case, the uniformity in the wafer surface is improved.

Figure 3:
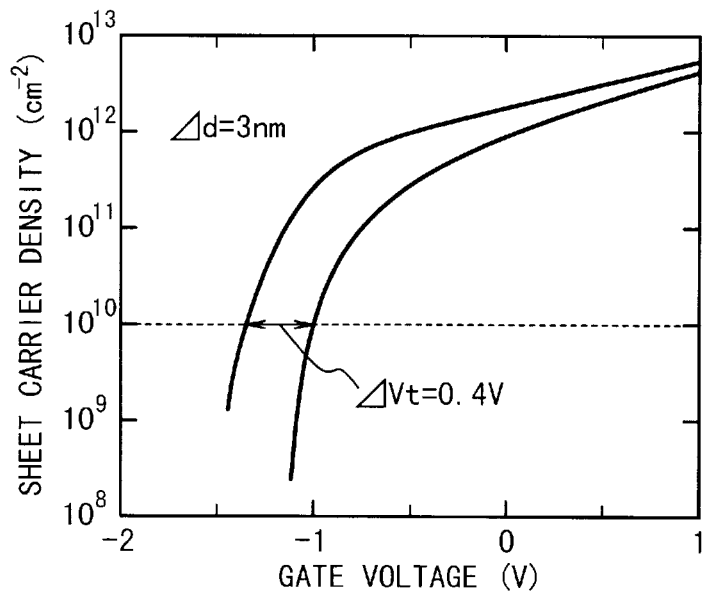
FIG. 3 is a graph illustrating a relation of gate voltage and sheet carrier density in the conventional field effect transistor.
Figure 7:
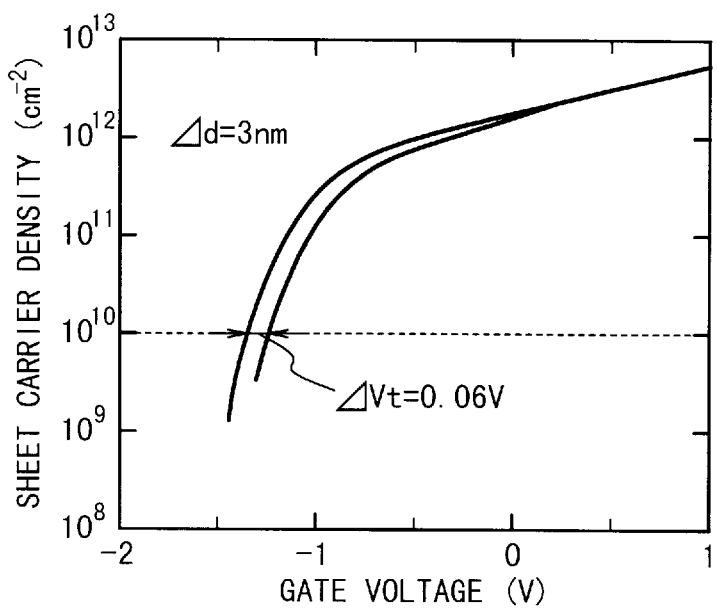
FIG. 7 is a graph illustrating a relation of gate voltage and sheet carrier density in the field effect transistor manufactured by the method according to the first embodiment of the present invention.

For example, the threshold voltage variation ΔVt when the film thickness change quantity Δd is 3 nm is 0.4 V in the conventional example as shown in FIG. 3, whereas, the threshold voltage variation ΔVt in the same case is suppressed to 0.06 V in this embodiment, as shown in FIG. 7. It should be noted that the threshold voltage Vt is defined as the gate voltage Vg when the sheet carrier density, i.e., the two-dimensional electron gas concentration is $10^{10} cm^{-2}$.

Figure 4:
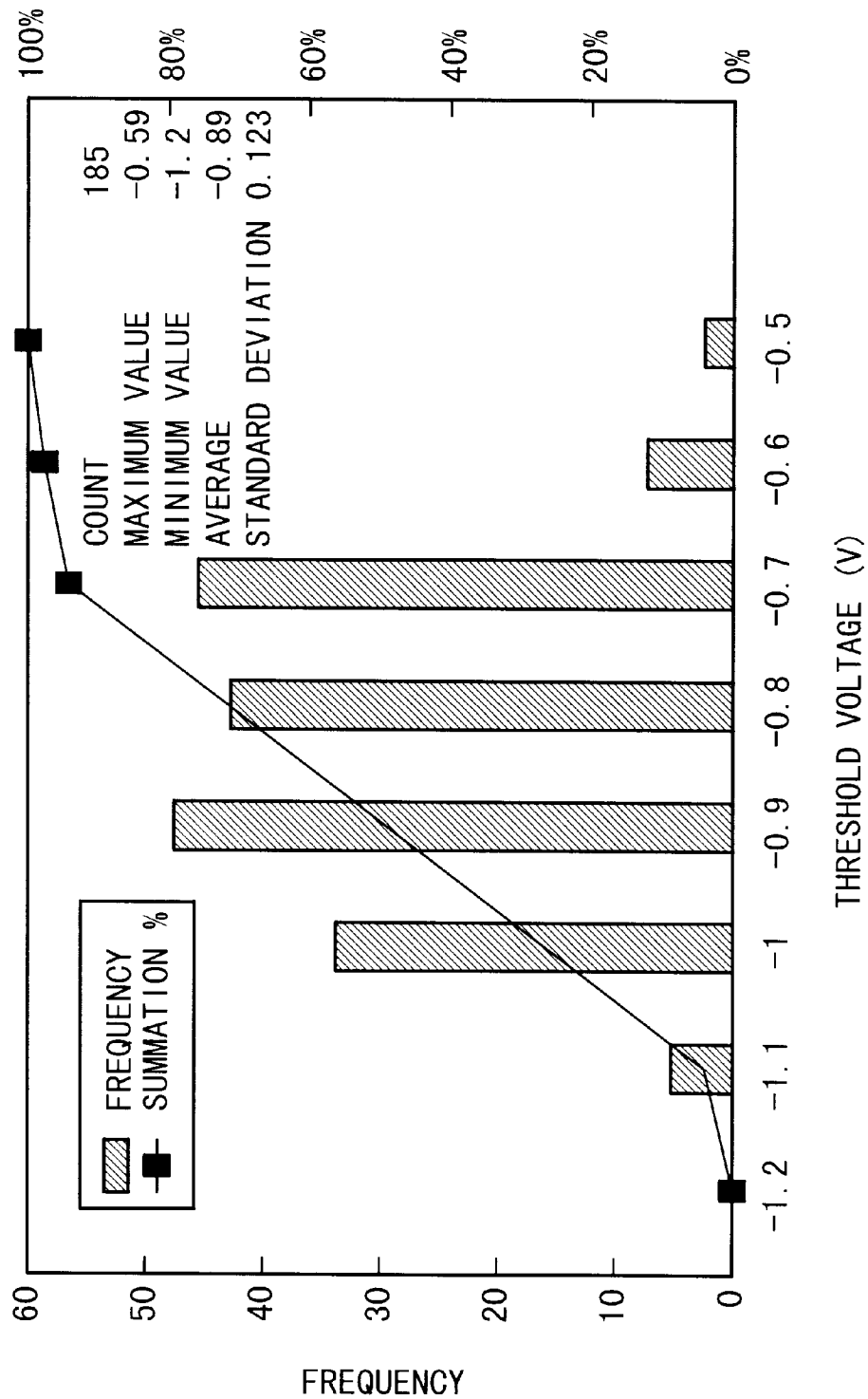
FIG. 4 is a graph illustrating a relation of threshold voltage and frequency in the conventional field effect transistor.

FIGS. 4 and 8 show frequency distributions of the threshold voltage in the conventional example and in the first embodiment, respectively. As seen from FIGS. 4 and 8, the standard deviation in the wafer surface is as large as 123 mV shown in FIG. 4 in the conventional example. On the other hand, the standard deviation is 44 mV and the uniformity is improved in the transistor in the first embodiment, as shown in FIG. 8.

The field effect transistor according to the second embodiment of the present invention will be described with reference to FIGS. 9A to 9D.

Figure 9A:
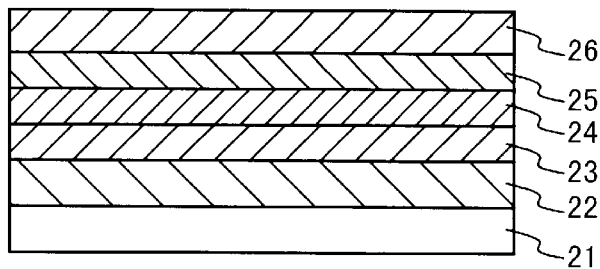
FIGS. 9A to 9D are cross sectional views of the field effect transistor manufactured by a method according to a second embodiment of the present invention.

As shown in FIG. 9A, a high purity intrinsic-type GaAs buffer layer 22 with the film thickness of 500 nm, a high purity $In_{0.2}Ga_{0.8}As$ channel layer 23 with the film thickness of 15 nm, a C-doped ($2 \times 10^{18} cm^{-3}$) p-type $Al_{0.75}Ga_{0.25}As$ hole supply layer 24 with the film thickness of 27 nm, a Si-doped ($2 \times 10^{18} cm^{-3}$) n-type $Al_{0.75}Ga_{0.25}As$ layer 25 with the film thickness of 22 nm having a conductive type opposite to the carrier supply layer or contacting the gate electrode, and a C-doped ($1 \times 10^{18} cm^{-3}$) p-type GaAs cap layer 26 with the film thickness of 300 nm are grown on a semi-insulating substrate 21 in this order by a MOCVD method.

Figure 9B:
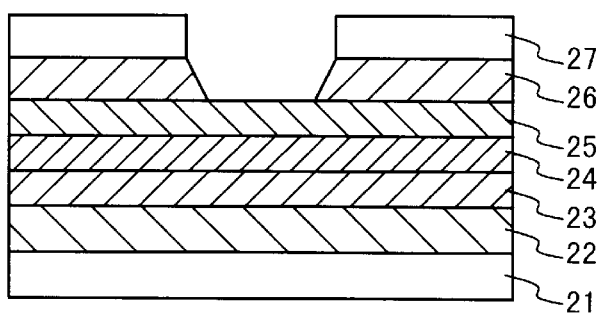

Next, as shown in FIG. 9B, after a photoresist layer 27 is patterned, the C-doped p-type GaAs cap layer 26 is crystal-etched so as to expose a portion of the Si-doped n-type $Al_{0.75}Ga_{0.25}As$ layer 25.

Figure 9C:
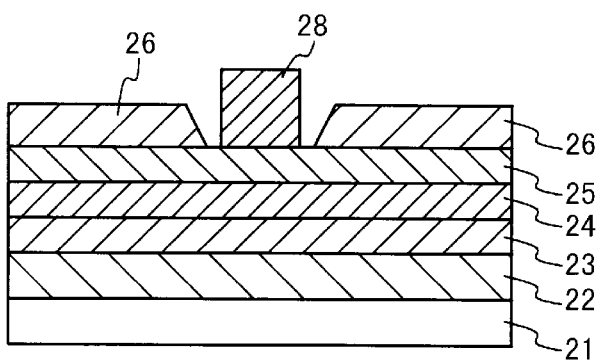

Next, as shown in FIG. 9C, a Schottky gate electrode 28 of a Ti/Pt/Au structure is formed on the exposed portion of the Si-doped n-type $Al_{0.75}Ga_{0.25}As$ layer 25. in a vacuum vapor deposition apparatus.

Figure 9D:
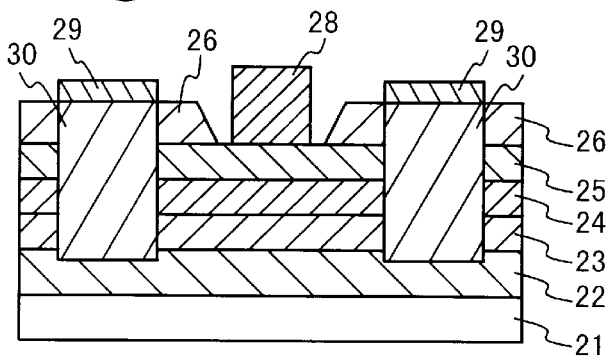

Next, as shown in FIG. 9D, ohmic electrodes 29 composed of AuZn/Ni/Au are formed as a source and a drain on the C-doped p-type GaAs cap layer 26 on both sides of Schottky gate electrode 28 in the vacuum vapor deposition apparatus. Then, heat treatment is performed at the temperature of 500° C. for alloying such that ohmic alloy layers 30 are formed. Thus, the field effect transistor is completed.

In this embodiment, carriers are holes and the gate electrode is applied with a voltage such that the PN-junction between the layers 24 and 25 is biased in a forward direction.

The field effect transistor according to the third embodiment of the present invention will be described below with reference to FIGS. 10A to 10D.

Figure 10A:
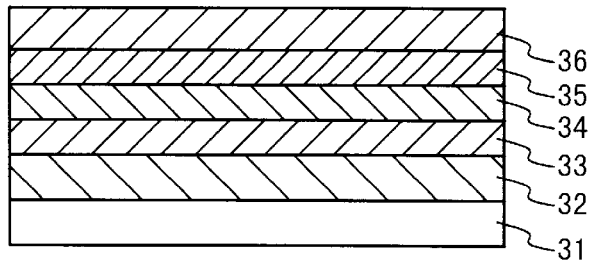
FIGS. 10A to 10D are cross sectional views of the field effect transistor manufactured by a method according to a third embodiment of the present invention.

As show in FIG. 10A, a high purity intrinsic-type GaAs buffer layer 32 with the film thickness of 500 nm, a high purity $In_{0.15}Ga_{0.85}As$ channel layer 33 with the film thickness of 15 nm, a Si-doped ($2 \times 10^{18} cm^{-3}$) n-type $Al_{0.2}Ga_{0.8}As$ electron supply layer 34 with the film thickness of 27 nm, a C-doped ($2 \times 10^{18} cm^{-3}$) p-type $Al_{0.2}Ga_{0.8}As$ layer 35 with the film thickness of 22 nm having a conductive type opposite to the carrier supply layer or contacting the gate electrode, and a Si-doped ($1 \times 10^{18} cm^{-3}$) n-type GaAs cap layer 36 with the film thickness of 300 nm are grown on a semi-insulating GaAs substrate 31 in this order by a MOCVD method.

Figure 10B:
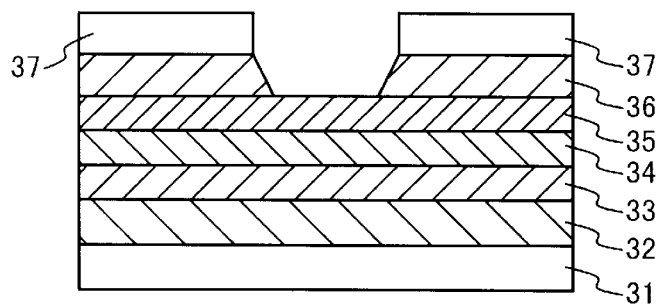

Next, as shown in FIG. 10B, after a photoresist layer 37 is patterned, the Si-doped n-type GaAs cap layer 36 is crystal-etched so as to expose a portion of the C-doped p-type $Al_{0.2}Ga_{0.8}As$ layer 35.

Figure 10C:
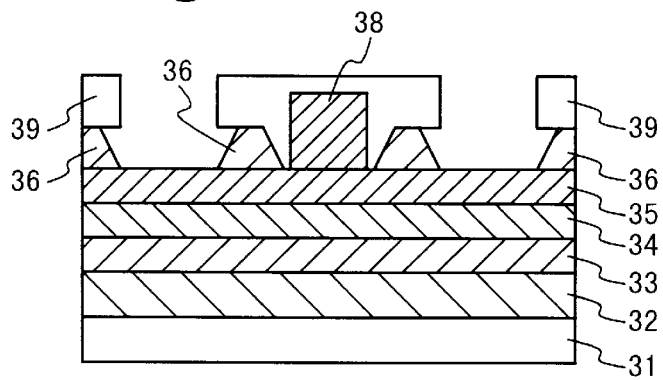

Next, as shown in FIG. 10C, a Schottky gate electrode 38 of a Ti/Pt/Au structure is formed on the exposed portion of the C-doped p-type $Al_{0.2}Ga_{0.8}As$ layer 35 in a vacuum vapor deposition apparatus.

Figure 10D:
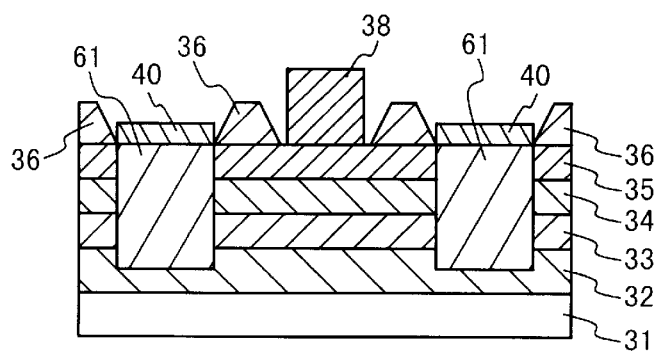

Next, as shown in FIG. 10D, after a photoresist layer 39 is patterned, the Si-doped n-type GaAs cap layer 36 is etched in ohmic electrode regions so as to expose portions of the C-doped p-type $Al_{0.2}Ga_{0.8}As$ layer 35. Then, ohmic electrodes 40 composed of AuGe/Ni/Au are formed as a source and a drain on the C-doped p-type $Al_{0.2}Ga_{0.8}As$ layer 35 on both sides of Schottky gate electrode 38 in the vacuum vapor deposition apparatus. Then, heat treatment is performed at the temperature of 450° C. for alloying such that ohmic alloy layers 41 are formed. Thus, the field effect transistor is completed.

It should be noted that in the third embodiment, the n-type GaAs cap layer 36 is completely etched to from the source and drain electrodes. However, if it is possible to alloy the layers from the n-type GaAs cap layer 36 to the $In_{0.15}Ga_{0.85}As$ channel layer 33 by the heat treatment or alloying, it is not necessarily needed to etch the n-type GaAs cap layer 36.

The field effect transistor according to the fourth embodiment of the present invention will be described with reference to FIGS. 11A to 11D.

Figure 11A:
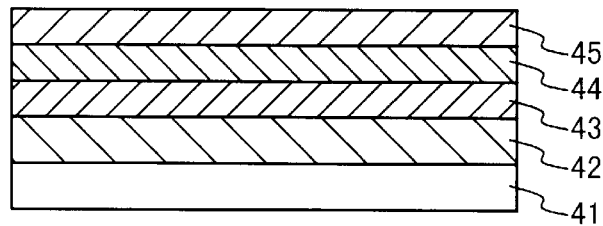
FIGS. 11A to 11D are cross sectional views of the field effect transistor manufactured by a method according to a fourth embodiment of the present invention.

As show in FIG. 11A, a high purity intrinsic-type GaAs buffer layer 42 with the film thickness of 500 nm, a Si-doped ($2 \times 10^{18} cm^{-3}$) n-type GaAs electron supply and channel layer 43 with the film thickness of 10 nm, a C-doped ($2 \times 10^{18} cm^{-3}$) p-type GaAs layer 44 with the film thickness of 10 nm having a conductive type opposite to the carrier supply layer or contacting the gate electrode, and a Si-doped ($1 \times 10^{18} cm^{-3}$) n-type GaAs cap layer 45 with the film thickness of 300 nm are grown on a semi-insulating GaAs substrate 41 in this order by a MOCVD method.

Figure 11B:
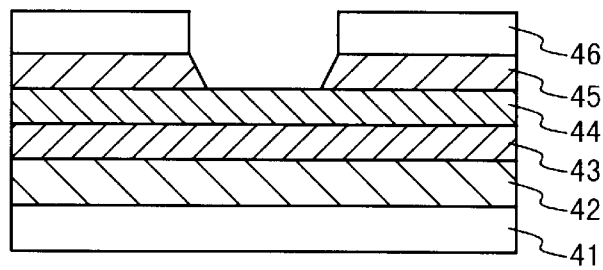

Next, as shown in FIG. 11B, after a photoresist layer 46 is patterned, the Si-doped n-type GaAs cap layer 45 is crystal-etched so as to expose a portion of the C-doped p-type GaAs layer 44.

Figure 11C:
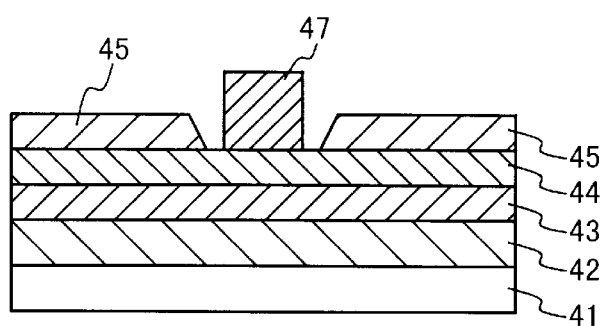

Next, as shown in FIG. 11C, a Schottky gate electrode 47 of a Ti/Pt/Au structure is formed on the exposed portion of the C-doped p-type GaAs layer 44 in a vacuum vapor deposition apparatus.

Figure 11D:
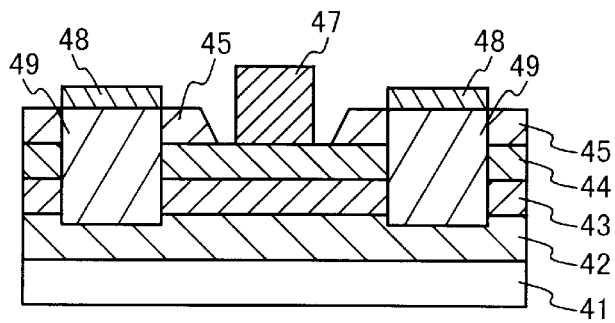

Next, as shown in FIG. 11D, ohmic electrodes 48 composed of AuGe/Ni/Au are formed as a source and a drain on the Si-doped n-type GaAs layer 45 on both sides of the Schottky gate electrode 47 in the vacuum vapor deposition apparatus. Then, heat treatment is performed at the temperature of 450° C. for alloying such that ohmic alloy layers 49 are formed. Thus, the field effect transistor is completed.

The field effect transistor according to the fifth embodiment of the present invention will be described below with reference to FIGS. 12A to 12D.

Figure 12A:
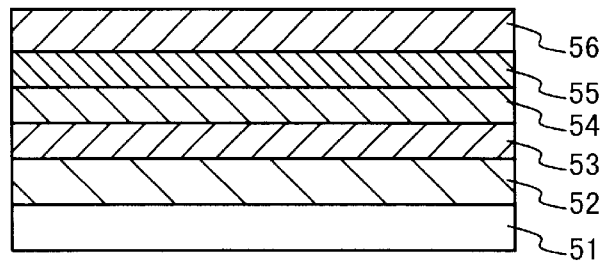
FIGS. 12A to 12D are cross sectional views of the field effect transistor manufactured by a method according to a fifth embodiment of the present invention.

As show in FIG. 12A, a high purity $In_{0.52}Al_{0.48}As$ buffer layer 52 with the film thickness of 250 nm, a high purity $In_{0.53}Ga_{0.47}As$ channel layer 53 with the film thickness of 80 nm, a Si-doped ($4 \times 10^{18} cm^{-3}$) n-type $In_{0.52}Al_{0.48}As$ electron supply layer 54 with the film thickness of 12 nm, a C-doped ($4\times10^{18}cm^{-3}$) p-type $In_{0.52}Al_{0.48}As$ layer 55 with the film thickness of 10 nm having a conductive type opposite to the carrier supply layer or contacting the gate electrode, and a Si-doped ($3\times10^{18}cm^{-3}$) n-type $In_{0.53}Ga_{0.47}As$ cap layer 56 with the film thickness of 300 nm are grown on a semi-insulating substrate 51 in this order by a MBE method.

Figure 12B:
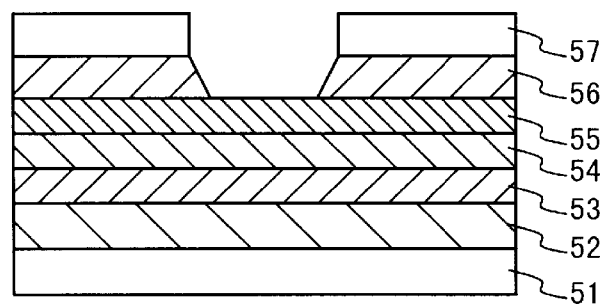

Next, as shown in FIG. 12B, after a photoresist layer 57 is patterned, the Si-doped n-type $In_{0.53}Ga_{0.47}As$ cap layer 56 is crystal-etched so as to expose a portion of the C-doped p-type $In_{0.52}Al_{0.47}As$ layer 55.

Figure 12C:
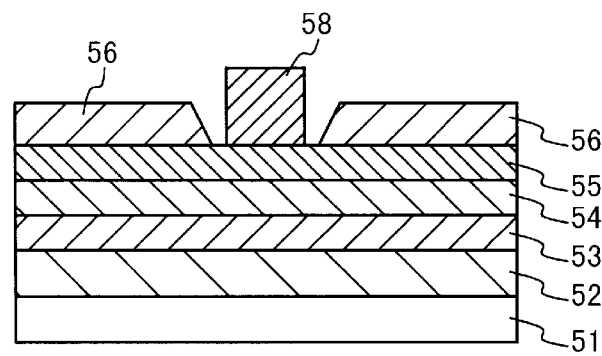

Next, as shown in FIG. 12C, a Schottky gate electrode 58 of Al is formed on the exposed portion of the C-doped p-type $In_{0.52}Al_{0.48}As$ layer 55 in a vacuum vapor deposition apparatus.

Figure 12D:
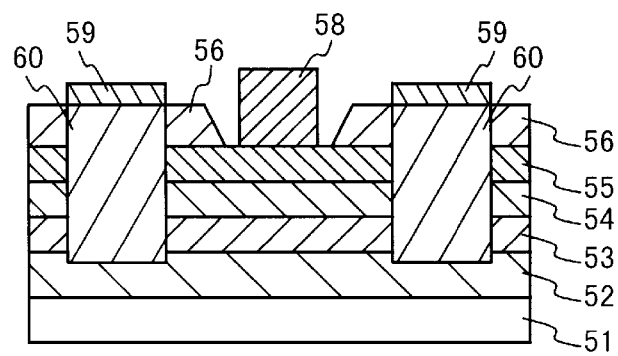

Next, as shown in FIG. 12D, ohmic electrodes 59 composed of AuGe/Au are formed as a source and a drain on the Si-doped n-type $In_{0.53}Ga_{0.47}As$ cap layer 56 on both sides of Schottky gate electrode 58 in the vacuum vapor deposition apparatus. Then, heat treatment is performed at the temperature of 350° C. for alloying such that ohmic alloy layers 60 are formed. Thus, the field effect transistor is completed.

Although the present invention is described above, the present invention is not limited to the materials and manufacturing methods which are shown in the above embodiments. Although a person in the art could consider various modifications based on the above description, such modifications are in the scope and spirit of the present invention.

As described above, according to the present invention, the inclination of the electrostatic potential distribution under the gate electrode can be made gentle. Therefore, even if it supposed that the film thickness of the layer having a conductive type opposite to the carrier supply layer or contacting the gate electrode is changed due to the epitaxial growth and crystal etching, the change quantity of the threshold voltage of the field effect transistor becomes small, compared with that of the conventional field effect transistor. This is because the electrostatic potential distribution curve is gentle. Thus, the uniformity can be also improved in the wafer surface. Further, the cap layer in the ohmic region may be etched. Therefore, the increase of the source resistance due to a PN junction can be avoided.

What is claimed is:

1. A field effect transistor comprising:
   a semiconductor layer formed for carriers to run therein;
   a first conductive semiconductor layer formed on said semiconductor layer to have an electron affinity smaller than that of said semiconductor layer and a summation of said electron affinity and a forbidden band width larger than a summation of said electron affinity and a forbidden band width of said semiconductor layer;
   a second conductive semiconductor layer formed of same materials as said first conductive semiconductor layer on said first conductive semiconductor layer to have a conductive type opposite to said first conductive semiconductor layer;
   a third conductive semiconductor layer formed on said second conductive semiconductor layer to have the same conductive type of said first conductive semiconductor layer; and
   a schottky gate electrode formed in contact with said second conductive semiconductor layer.

2. A field effect transistor according to claim 1, further comprising drain and source electrodes formed in contact with said third conductive semiconductor layer.

3. A field effect transistor according to claim 1, further comprising drain and source electrodes formed in contact with said second conductive semiconductor layer.

4. A field effect transistor according to claim 1, wherein said semiconductor layer is one of an intrinsic type GaAs layer and an intrinsic type InGaAs layer, said first conductive semiconductor layer is an N-type AlGaAs layer, said second conductive semiconductor layer is a P-type AlGaAs layer, and said third conductive semiconductor layer is an N-type GaAs layer.

5. A field effect transistor according to claim 1, wherein said semiconductor layer is one of an intrinsic type GaAs layer and an intrinsic type InGaAs layer, said first conductive semiconductor layer is a P-type AlGaAs layer, said second conductive semiconductor layer is an N-type AlGaAs layer, and said third conductive semiconductor layer is a P-type GaAs layer.

6. A field effect transistor according to claim 1, wherein said semiconductor layer is an intrinsic type InGaAs layer, said first conductive semiconductor layer is an N-type InAlAs layer, said second conductive semiconductor layer is a P-type InAlAs layer, and said third conductive semiconductor layer is an N-type InGaAs layer.

7. A field effect transistor comprising:
   an intrinsic type InGaAs channel layer;
   an N-type InAlAs carrier supply layer formed on said channel layer;
   a P-type InAlAs contact layer on said carrier supply layer;
   an N-type InGaAs cap layer formed on said contact layer; and
   a schottky gate electrode formed in contact with said layer having a conductive type opposite to the carrier supply layer, and
   wherein said contact layer reduces a change of a threshold voltage as a function of a film thickness of said contact layer.

8. A field effect transistor according to claim 7, wherein said carrier supply layer is formed on said channel layer to have an electron affinity smaller than that of said channel layer and a summation of said electron affinity and a forbidden band width larger than a summation of said electron affinity and a forbidden band width of said channel layer.

9. A field effect transistor according to claim 7, further comprising drain and source electrodes formed in contact with said cap layer.

10. A field effect transistor according to claim 7, further comprising drain and source electrodes formed in contact with said layer having a conductive type opposite to the carrier supply layer.

11. In a heterojunction field effect transistor (HJFET) having an intrinsic semiconductor buffer layer, an intrinsic semiconductor channel layer on said buffer layer, a first conductivity type, first semiconductor material supply layer on said channel layer, said supply layer having an electron affinity smaller than that of said channel layer and a sum of the electron affinity and a forbidden band width larger than that of said channel layer, a first conductivity type semiconductor cap layer on said supply layer and having an opening through said cap layer, a Schottky gate electrode in said opening, and ohmic source and drain electrodes on two sides of said gate electrode, the improvement comprising:
   a second conductivity type, first semiconductor material contact layer between and contacting said cap layer and said supply layer and that is exposed in said opening, said gate electrode contacting said contact layer through said opening.

12. The improved HJFET of claim 11, wherein said source and drain electrodes contact said contact layer through said opening.

13. The improved HJFET of claim 11, wherein said source and drain electrodes contact said cap layer.

14. The improved HJFET of claim 11, wherein the first conductivity type is N type and the first semiconductor material comprises InAlAs.

15. The improved HJFET of claim 11, wherein the first conductivity type is N type and the first semiconductor material comprises AlGaAs.

16. The improved HJFET of claim 11, wherein the first conductivity type is P type and the first semiconductor material comprises AlGaAs.

* * * * *